US006870267B2

(12) United States Patent
Zohni

(10) Patent No.: US 6,870,267 B2
(45) Date of Patent: Mar. 22, 2005

(54) OFF-CENTER SOLDER BALL ATTACH ASSEMBLY

(75) Inventor: Wael Zohni, Newark, CA (US)

(73) Assignee: Tessera, Inc., San Jose, CA (US)

( * ) Notice: Subject to any disclaimer, the term of this patent is extended or adjusted under 35 U.S.C. 154(b) by 302 days.

(21) Appl. No.: 10/077,145

(22) Filed: Feb. 15, 2002

(65) Prior Publication Data

US 2002/0117761 A1 Aug. 29, 2002

Related U.S. Application Data

(62) Division of application No. 09/652,537, filed on Aug. 31, 2000, now Pat. No. 6,380,060.
(60) Provisional application No. 60/187,824, filed on Mar. 8, 2000.

(51) Int. Cl.[7] ............................................. H01L 23/48
(52) U.S. Cl. ........................ 257/773; 257/737; 257/779; 257/786
(58) Field of Search ................................. 257/734, 737, 257/738, 750, 773, 774, 779, 780, 781, 786

(56) References Cited

U.S. PATENT DOCUMENTS

| | | | |
|---|---|---|---|
| 5,148,265 A | 9/1992 | Khandros et al. .............. 357/80 |
| 5,148,266 A | 9/1992 | Khandros et al. .............. 357/80 |
| 5,216,278 A | 6/1993 | Lin et al. ..................... 257/688 |
| 5,518,964 A | 5/1996 | DiStefano et al. .......... 437/217 |
| 5,597,470 A | 1/1997 | Karavakis et al. ............. 216/14 |
| 5,679,194 A | 10/1997 | Fjelstad et al. ............. 156/150 |
| 5,706,178 A | * 1/1998 | Barrow ......................... 361/777 |
| 5,738,269 A | 4/1998 | Masterton ................. 228/248.1 |
| 5,763,941 A | 6/1998 | Fjelstad ....................... 257/669 |
| 5,796,589 A | 8/1998 | Barrow ......................... 361/777 |
| 5,796,590 A | 8/1998 | Klein ..................... 228/180.22 |
| 5,798,286 A | 8/1998 | Faraci et al. ................. 438/107 |
| 5,807,453 A | 9/1998 | Smith et al. ................. 156/150 |
| 5,859,472 A | 1/1999 | DiStefano et al. ........... 257/674 |
| 5,875,102 A | 2/1999 | Barrow ......................... 361/777 |
| 5,913,109 A | 6/1999 | Distefano et al. ............ 438/117 |
| 5,915,752 A | 6/1999 | DiStefano et al. ............. 29/827 |
| 5,937,276 A | 8/1999 | Distefano .................... 438/106 |
| 5,976,913 A | 11/1999 | Distefano .................... 438/123 |
| 6,201,305 B1 | 3/2001 | Darveaux et al. ........... 257/779 |
| 6,265,776 B1 | 7/2001 | Gilleo ......................... 438/613 |

OTHER PUBLICATIONS

TBGA Package Technology, IEEE Transactions on Components, Packaging and Manufacturing Technology, Part B. vol. 17, No. 4, VP 564–568 by Adros and Hammer.
Ball Grid Array Technology, Lau, J.H. ed. pp. 460–464.

* cited by examiner

Primary Examiner—Kevin M. Picardat
(74) Attorney, Agent, or Firm—Lerner, David, Littenberg, Krumholz & Mentlik, LLP

(57) ABSTRACT

A connection component includes a dielectric element having a first surface and a second surface, and conductive pads on the first surface of the dielectric element, each conductive pad having a center. The connection component also includes conductive vias electrically connected to the conductive pads and extending toward the second surface of the dielectric element, each of the vias having an opening at one of the conductive pads. At least one of the via openings is offset from the center of at least one of the conductive pads.

17 Claims, 11 Drawing Sheets

FIG. 4

| SPLIT (1 STRIP) | FLUX | BALL PLACEMENT | POST-FLUX BAKE | PEAK TEMP (degC) | DWELL (SEC/ZONE) | VOIDS | AVERAGE SIZE |
|---|---|---|---|---|---|---|---|
| 1 | STANDARD | STANDARD | NONE | 195 | 20 | 107 | =5 mils |
| 2 | STANDARD | STANDARD | 5MIN@75C | 220 | 55 | >40 | =5 mils |
| 3 | STANDARD | STANDARD | 10MIN@100C | 235 | 60 | >40 | >5 mils |
| 4 | STANDARD | STANDARD | NONE | 225 | 60 | >40 | =5 mils |
| 5 | STANDARD | STANDARD | 5MIN@100C | 225 | 60 | >40 | =5 mils |
| 6 | STANDARD | STANDARD | NONE | 220 | 55 | 33 | =5 mils |
| 7 | STANDARD | STANDARD | 60MIN@100C | 210 | 50 | 30 | <5 mils |
| 8 | STANDARD | STANDARD | NONE | 230 | 60 | 49 | >5 mils |
| 9 | STANDARD | STANDARD | NONE | 210 | 50 | 49 | =5 mils |
| 10 | PASTE | STANDARD | 5MIN@120C | 210 | 50 | 104 | =5 mils |
| 11 | PASTE | STANDARD | NONE | 210 | 50 | 19 | <5 mils |
| 12 | PASTE FILL | STANDARD | NONE | 210 | 60 | 67 | =5 mils |
| 13 | OFF-CENTER | OFF-CENTER | NONE | 225 | 60 | 7 | <5 mils |
| 14 | OFF-CENTER | OFF-CENTER | NONE | 195 | 20 | 25 | <5 mils |
| 15 | OFF-CENTER | OFF-CENTER | NONE | 225 | 60 | 101 | =5 mils |
| 16 | OFF-CENTER | OFF-CENTER | NONE | 225 | 60 | 6 | <5 mils |
| 17 | OFF-CENTER | OFF-CENTER | NONE | 225 | 60 | 8 | <5 mils | ns
OFF-CENTER SOLDER BALL ATTACH ASSEMBLY

CROSS-REFERENCE TO RELATED APPLICATIONS

The present application is a divisional of U.S. patent application Ser. No. 09/652,537, filed Aug. 31, 2000, now U.S. Pat. No. 6,380,060, which in turn claims benefit of U.S. Provisional Application Ser. No. 60/187,824 filed Mar. 8, 2000, the disclosures of which is hereby incorporated by reference herein.

BACKGROUND OF THE INVENTION

The present invention relates to microelectronic connection components and more specifically relates to methods of attaching solder balls to conductive pads or terminals on a microelectronic element, such as a microelectronic connection component.

Soldered connections are typically used throughout the electronics industry to connect electronic components. Where the components to be connected include dielectric elements, such as a printed circuit board or a flexible dielectric sheet having conductive metal traces, the traces may be provided with enlarged regions, commonly referred to as "lands" or "conductive pads." A mass of solder may be deposited on each conductive pad by exposing the assembly to a liquid solder or, more typically, by applying solder preforms commonly referred to as "solder balls" onto the pads and heating the assembly to melt or reflow the solder balls. Solder balls are typically reflowed by raising the temperature of the solder balls above a predetermined temperature, generally referred to as the melting point of the solder balls. The melting point is defined as the temperature at which the solder balls transform from a first solid or frozen condition to a second molten or at least partially liquid condition. Once the solder balls transform to the second at least partially liquid condition, the solder balls remain in the least partially liquid condition as long as the temperature of the solder material is maintained at or above its melting point. The reflowed solder typically wets to the metal of the conductive pads to form a strong bond between the pads and the solder. After the solder balls have wet to the conductive pads, the temperature of the solder balls may be reduced to a level below the melting point, whereupon the solder balls transform from the second at least partially liquid condition to the first solid condition.

After application of the solder masses, the component typically has solder masses protruding from the surface. A semiconductor chip package having an array of solder masses on a surface in a grid-like pattern is sometimes referred to as a "ball-grid array" element. The use of ball-grid arrays in packages for microelectronic devices such as semiconductor chips is described for example, in the article "TBGA Package Technology," IEEE Transactions on Components, Packaging and Manufacturing Technology, Part B, Vol. 17, No. 4, VP 564–568 by Andros and Hammer and in "Ball Grid Array Technology," Lau, J. H. ed, pp. 460–464.

Commonly assigned U.S. Pat. Nos. 5,148,265 and 5,148, 266, the disclosures of which are hereby incorporated by reference herein, describe, in certain preferred embodiments, microelectronic packages having a set of conductive pads in the form of terminals which may be mounted on a dielectric layer such as a flexible sheet. The conductive pads may be connected to contacts on a semiconductor chip by flexible leads and may be supported above the surface of the chip by a compliant layer such as an elastomer located between the terminals and the chip, typically between the dielectric layer and the chip. Solder masses may be attached to the pads or terminals for connecting the assembly to a circuit board or other substrate having corresponding pads.

The microelectronic packages described above can be engaged with another component having a corresponding set of contact pads. After engaging the protruding solder masses with the pads of the other component, the solder masses may be heated again to melt all or part of each solder mask and bond the solder masses to the contact pads of the other component. The resulting solder columns electrically interconnect pads on both components with one another electronically and also form a mechanical connection between the components.

The presence of oxides on solder balls adversely affects the ability of the solder balls to wet to and ultimately bond with contact pads. As is well known to those skilled in the art, if an oxide layer is not adequately removed from a contact pad, then molten solder will not wet to the pad, thereby resulting in the formation of a poor bond between the molten solder and the contact pad. In order to avoid this problem, some bonding processes include the steps of removing oxides from both the solder balls and the contact pads, such as by scrubbing the surfaces of the solder balls and contact pads. Another solution for removing oxides is to use flux during the bonding process. In addition to facilitating placement of solder balls on conductive pads, flux aids in the removal of oxides that develop when the pads and solder balls are exposed to the environment.

FIG. 1A shows a flexible dielectric sheet 10 having a first surface 12 and a second surface 14 remote therefrom. The dielectric sheet is preferably a flexible polymeric material. The connection component 10 includes one or more conductive pads 18 formed over the first surface 12 of the dielectric sheet 10. The dielectric sheet 10 includes metal lined vias 20 extending between the first surface 12 and the second surface 14 of the dielectric sheet 10. The metal lined vias 20 have first ends 22 attached to conductive pads 18 and second ends 24 attached to conductive traces 26. Referring to FIG. 1A-1, the conductive traces 26A and 26B extend along the second surface 14 of the dielectric sheet 10. In the embodiment shown in FIG. 1A-1, the first conductive trace 26A extends in a first direction that is substantially perpendicular to the direction of the second conductive trace 26B.

Referring to FIG. 1B, it may be desired to bond and/or attach one or more solder balls 28 to the conductive pads 18. Before the solder balls 28 are placed atop the conductive pads 18, a flux material 30 is placed atop each conductive pad 18. The flux material facilitates placement of the solder balls 28 atop the conductive pads by temporarily holding the solder balls in place until the solder balls can be reflowed and permanently connected to the conductive pads 18. The flux material 30 also removes oxides that may have formed atop the exterior surface of the conductive pads 18. The use of flux for removing oxide layers is of critical importance as the reflowed solder 28 will be unable to wet to the surface of the conductive pads unless the oxide layer is removed therefrom. FIG. 1B-1 shows a top view of the connection component 10 of FIG. 1B. The pads of flux material 30 are provided atop conductive pads 18. Solder balls 28 are centered over the conductive pads 18 and atop the flux 30. As shown in FIGS. 1B and 1B-1, the flux 18 and solder balls 28 cover the via openings 20. As will be described in more detail below, because the via openings 20 are covered by flux 18 and the solder balls 28, air and vapors from the flux may be trapped in the vias 20 when the solder balls are reflowed. As a result, the heated air and flux vapors have no room to expand. FIG. 1C shows the connection component 10 during a solder reflow step. The solder balls 28 may comprise a tin/lead solder composition having a melting point of 320° C. When heat is applied to the solder balls 28, the flux 30 at least partially fills up the vias and the expanding hot air and/or vapors from the flux generally has no opportunity to escape through the via opening. As a result, as the air and/or vapors from the flux within the via 20 expand, the air and/or the vapors flow into the center of the liquid solder 28 to form one or more voids 32 in a central portion of the solder balls 28.

FIG. 1D shows the solder balls 28 after they have been reflowed and permanently attached to conductive pads 18. When viewing the attached solder balls from an exterior surface, the balls 28 appear to be solid. However, the centers of the balls 28 typically have one or more voids. As mentioned above, the voids may dramatically diminish the reliability of the connection component. Although the present invention is not limited to any particular theory of operation, it is believed that solder balls having voids will fail sooner than solder balls without voids. This is because the solder balls with voids have a tendency to crack during thermal cycling which may adversely affect the ability of the connection component to maintain an electrical interconnection with another circuit element. Moreover, the existence of voids in solder balls may cause the solder balls to be improperly dimensioned. Such improperly dimensioned solder balls will cause non-planarity of a package, making it difficult to place the package in a test socket or attach the package to a substrate. As a result, packages having improperly dimensioned solder balls with voids are rejected at a much higher rate than packages having properly dimensioned solder balls.

Thus, there is a need for improved methods for connecting solder balls to microelectronic elements that minimize the voiding problems described above.

SUMMARY OF THE INVENTION

In accordance with certain preferred embodiments of the present invention, a method of placing solder balls on a connection component includes providing a dielectric element, such as a two-metal layer dielectric tape, having first conductive elements on a first surface, second conductive elements on a second surface, and conductive vias electrically interconnecting the first conductive elements and the second conductive elements. The conductive vias may be lined with a conductive metal, such as copper, or a conductive polymer. In certain preferred embodiments, the connection component may comprise, inter alia, a substrate, a circuitized panel such as a printed circuit board, an interposer or a flexible dielectric sheet.

In certain preferred embodiments, the first conductive elements are conductive pads and the second conductive elements are conductive traces having tip ends releasably secured to the dielectric element. The vias preferably extend between the first and second surfaces of the dielectric element. Each via preferably has an open end adjacent the first surface of the dielectric element. In certain preferred embodiments, one or more vias may have a closed end adjacent the second surface of the dielectric element. The method preferably includes positioning solder balls atop one or more of the first conductive elements, and reflowing the solder balls for permanently attaching the solder balls to the first conductive elements. The solder balls may be positioned by first depositing a pad of a flux material atop each first conductive element and then placing a solder ball atop each flux pad. In other embodiments, the solder balls may be positioned by providing a stencil having a plurality of openings, juxtaposing the stencil with the first surface of the dielectric element so that the stencil openings are in substantial registration with the first conductive elements, and placing a solder ball in each stencil opening so that a solder ball is positioned atop each first conductive elements. The stencil is desirably maintained in juxtaposition with the first surface of the dielectric element during the reflowing step.

At the commencement of the reflowing step, at least a portion of one or more via openings are exposed. In other words, after the solder balls have been positioned atop the conductive pads and at the beginning of the reflowing step, the solder balls will not completely cover the via openings. As a result, when the solder balls are heated up during reflow, the expanding air and/or flux vapors in the vias can escape through the via openings before the openings are completely covered by molten solder material.

The connection component of the present invention may be connected with a microelectronic element, such as a semiconductor chip or a semiconductor wafer, having contacts on a contact bearing face. In one preferred embodiment, the tip ends of the conductive traces of the dielectric element are bonded with the contacts of the microelectronic element for electrically interconnecting the microelectronic element and the dielectric element. Commonly assigned U.S. Pat. Nos. 5,937,276; 5,915,752 and 5,913,109, the disclosures of which are hereby incorporated by reference herein, disclose, in certain preferred embodiments, methods of bonding leads or traces to contacts or pads. The electrically interconnecting step preferably includes juxtaposing the contact bearing face of the microelectronic element with the second surface of the dielectric element and bonding the conductive traces to the contacts of the microelectronic element. A compliant layer may be provided between the contact bearing face of the microelectronic element and the second face of the dielectric element. In one embodiment, the compliant layer is provided by introducing a composition curable to an elastomer between the contact bearing face of the microelectronic element and the second surface of the dielectric element and then curing the composition to form an elastomer.

In other preferred embodiments of the present invention, a connection component includes a dielectric element having a first surface and a second surface. The connection component includes conductive pads provided on the first surface of the dielectric element and conductive vias electrically connected to the conductive pads. Each via preferably has an opening at one of the conductive pads. Each via may extend from the first surface toward the second surface of the dielectric element. Each via preferably has a center point that is equidistant from the sidewalls of the via. Each conductive pad preferably has a center point that is equidistant from the edges of the pad. The centers of at least some of the vias are offset from the centers of at least some of the conductive pads. In certain preferred embodiments, fusible masses such as solder balls are attached to the conductive pads on the first surface of the dielectric element. The fusible masses are preferably positioned adjacent to an edge of at least one of the via openings so that at least one of the via openings is partially exposed at the commencement of a solder ball reflow step.

BRIEF DESCRIPTION OF THE DRAWINGS

FIG. 4 is a chart comparing the number of voids detected in solder masses for different methods for connecting solder balls to conductive pads.

DETAILED DESCRIPTION

Figure 2A:
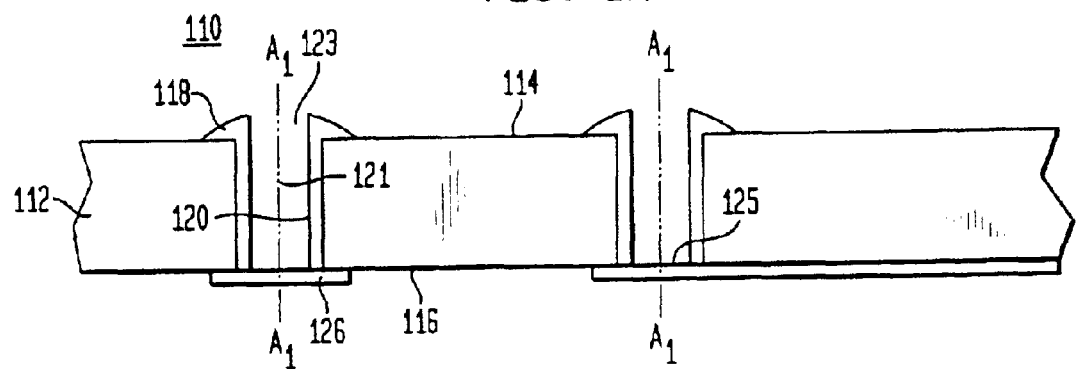
FIGS. 2A–2E shows a method for attaching solder masses to a connection component, in accordance with certain preferred embodiments of the present invention.
Figures 1, 2A:
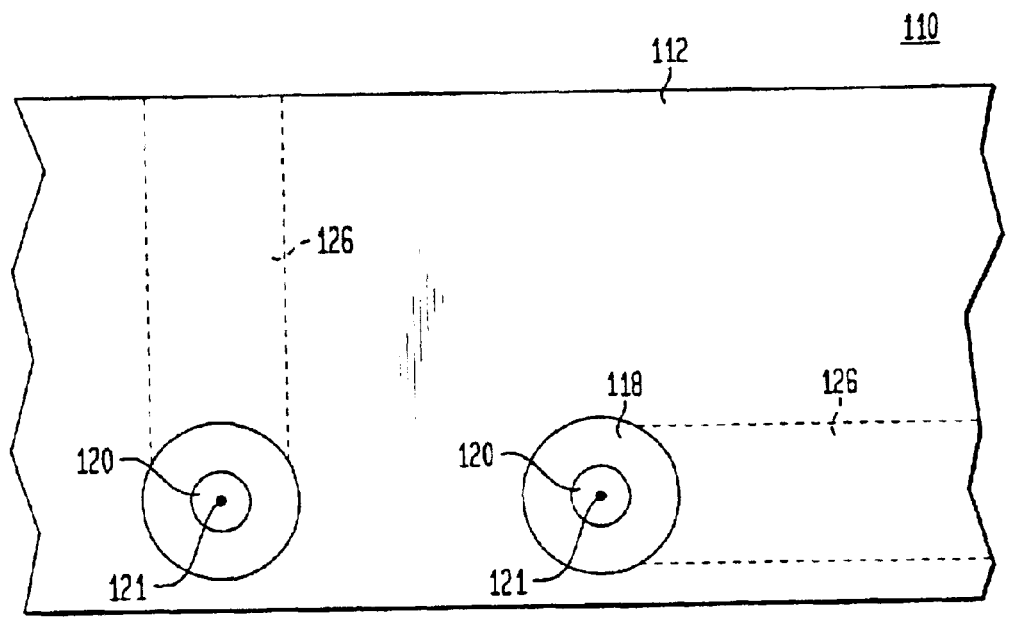

FIGS. 2A–2D shows a preferred method of attaching solder balls to a connection component that minimizes the voiding problems described above. Referring to FIG. 2A, a connection component 110 includes a flexible dielectric layer 112 having a first surface 114 and a second surface 116 remote therefrom. The connection component 110 includes conductive pads 118 atop the first surface 114 and metalized vias 120 that extend between the first surface 114 and the second surface 116 of the dielectric sheet 112. Each via 120 has a center 121 and an open end 123 adjacent the first surface 114 of dielectric layer 112. The center 121 of via 120 shown in FIG. 2A is defined by axis $A_1$—$A_1$. Thus, the center 121 of each via 120 preferably in located along a line that is equidistant from the sidewalls of the via 120. Each via 120 may also include a closed end 125 remote from the open end 123. In the particular embodiment shown in FIG. 2A, the closed end 125 of via 120 is adjacent the second surface 116 of dielectric sheet 112.

Figure 1A:
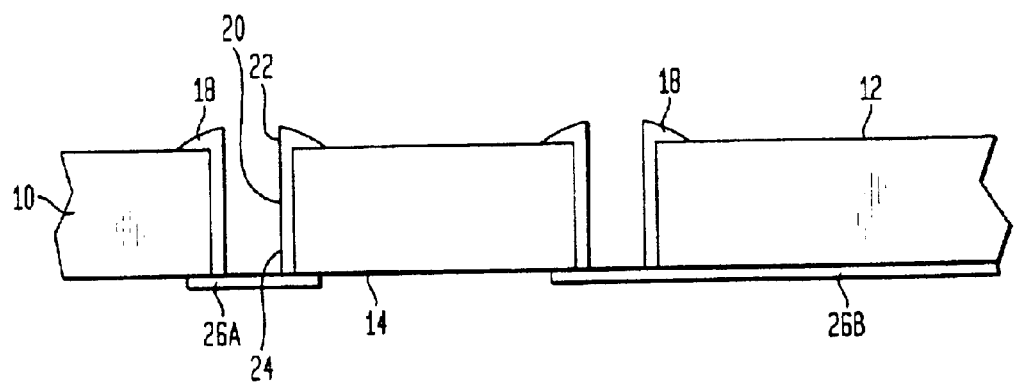
FIGS. 1A–1D show a prior art method for attaching solder balls to a connection component.
Figures 1, 1A:
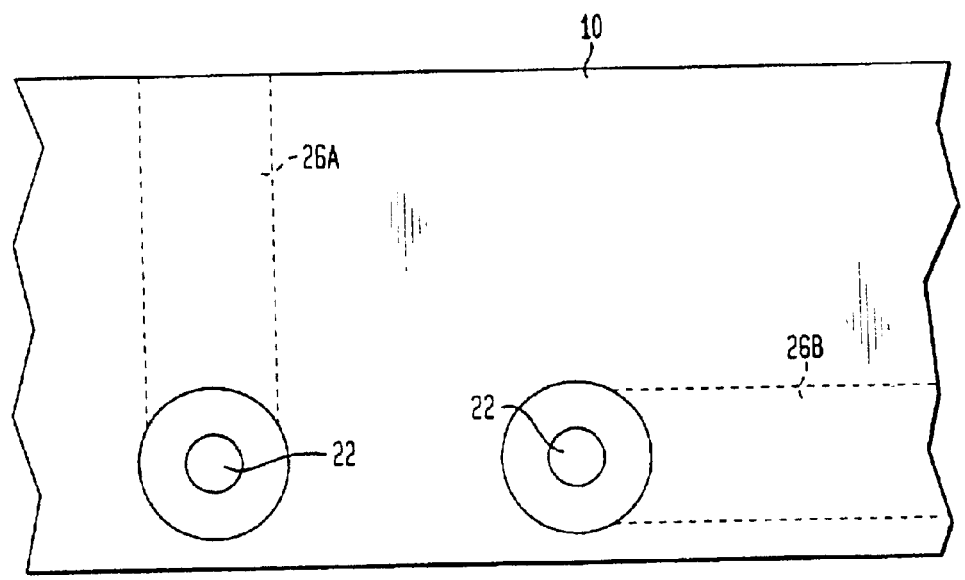
FIGS. 3A through 3C-1 show a method of attaching solder masses to a connection component, in accordance with further preferred embodiments of the present invention.
Figure 1B:
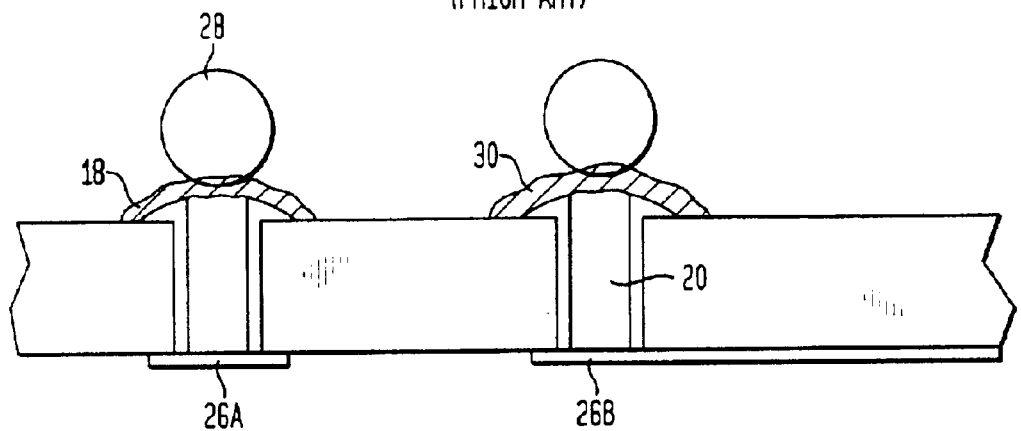
Figures 1, 1B:
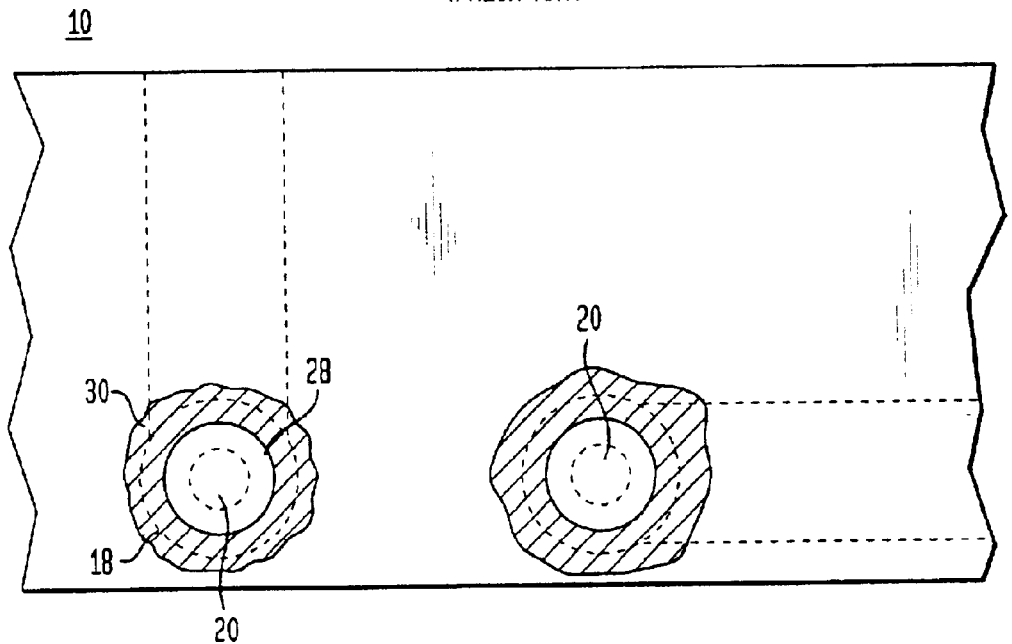
Figure 1C:
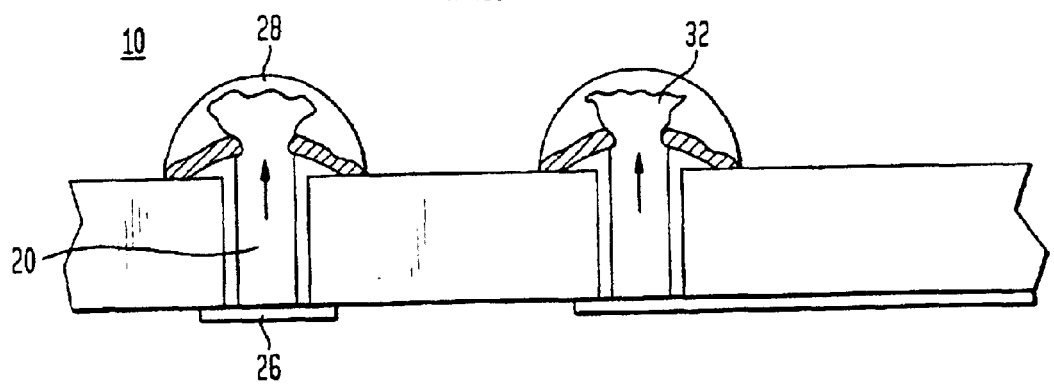
Figure 1D:
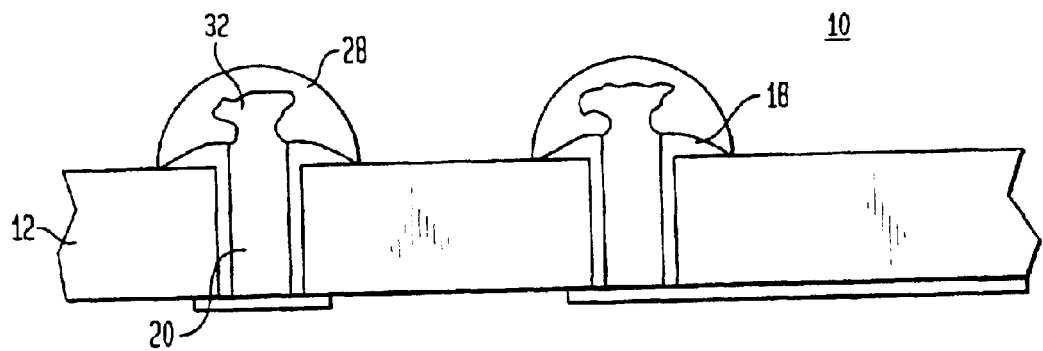

In certain preferred embodiments, the conductive pads 118 have a diameter of approximately 10–14 mils and the vias 120 have a diameter of approximately 4–6 mils. The metalized vias 120 electrically interconnect the conductive pads 118 with conductive traces or leads 126 extending along the second surface 116 of the flexible dielectric sheet 112. The leads preferably comprise a conductive metal such as copper. U.S. Pat. Nos. 5,859,472; 5,807,453; 5,679,194 and 5,597,470, the disclosures of which are hereby incorporated by reference herein, describe, in certain preferred embodiments, lead structures for electrically interconnecting microelectronic elements. The leads 126 may also have first ends permanently secured to dielectric sheet 112 and second ends releasably secured to the dielectric sheet. Releasable or peelable leads are disclosed in certain preferred embodiments of U.S. patent application Ser. Nos. 09/200,100; 09/020,750; 09/195,371; and 09/225,669 and U.S. Pat. No. 5,763,941, the disclosures of which are hereby incorporated by reference herein. FIG. 2A-1 shows that the conductive traces 126 may extend in difference directions along the second surface 116 of the dielectric sheet 112.

The conductive pads 118 may comprise any conductive material but preferably comprise copper, gold or gold-plated copper. Gold-plated copper is highly preferred because gold is oxidation resistant. As a result, the gold-plated pads will have little or no oxides formed thereon. As is well known to those skilled in the art, the absence of oxides will allow conductive materials to wet to the pads.

Figure 2B:
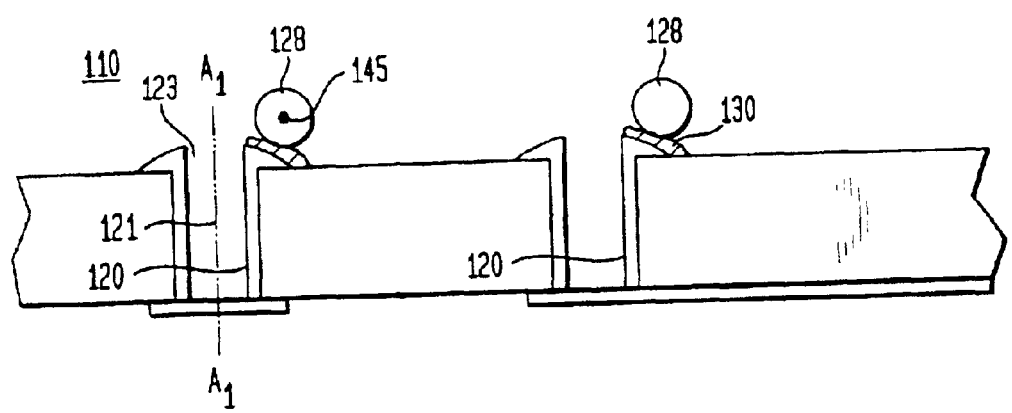

Referring to FIG. 2B, flux 130 may be placed atop the conductive pads 118 prior to placing solder balls atop the pads. The flux 130 is preferably positioned so that at least a portion of each via 120 is exposed. In other words, the via opening should not be completely covered by the flux. A solder ball 128 is then placed atop each pad of flux. The solder balls 128 are also positioned so that at least a portion of each via is exposed. This may be accomplished by ensuring that a center 145 of solder ball 128 is not positioned over the center 121 of via 120. In other words, the center 145 of solder ball 128 should be offset from the center 121 of via 120 so that the flux and solder ball combination does not completely close off the open end 123 of the vias 120. Thus, the flux 130 and solder balls 128 are placed to one side of the via openings 120 as shown in FIG. 2B. The solder balls preferably comprise any type of conductive material that is capable of being reflowed. Preferred solder materials include eutectic solders and tin/lead solders. Particularly preferred solder materials include eutectic tin/lead solder. Preferred solder materials may also include lead free solders, such as tin/silver based alloys comprising 90–96% tin, 3–5% silver and 1-1-1/2% of a third element such as copper or bismuth.

Figure 2C:
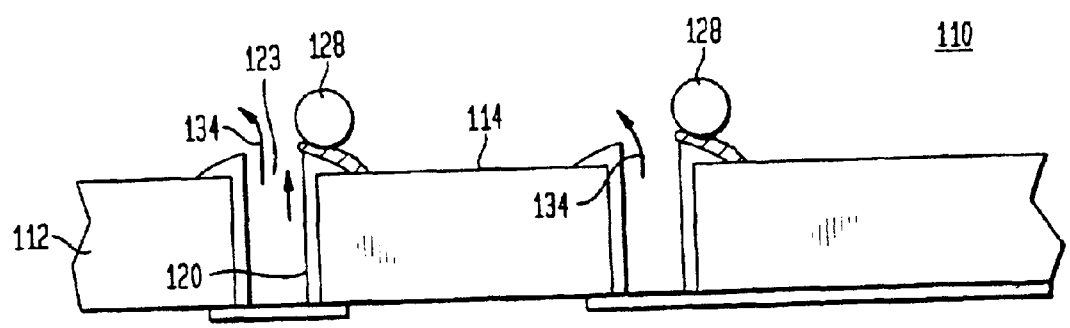

Referring to FIG. 2C, when the solder balls 128 are heated up during reflow, the air and flux vapors in the vias 120 will also heat up and expand. However, unlike the prior art embodiment shown above, the air in the vias will be able to escape through the at least partially exposed via opening 123 as designated by arrows 134. Thus, the expanding air and flux vapors within the vias 120 may escape from the opening at the first surface 114 of the dielectric layer 112 and will not become trapped within the reflowed solder 128 (as frequently occurs with prior art methods for attaching solder balls). In certain preferred embodiments, during reflow, the solvents in the flux 130 are preferably activated at between 120–220° C. The solvents may remove any oxides present on the pads. Furthermore, since the flux is offset from the via openings, flux vapors generated upon heating generally will not be trapped in the vias.

Figure 2D:
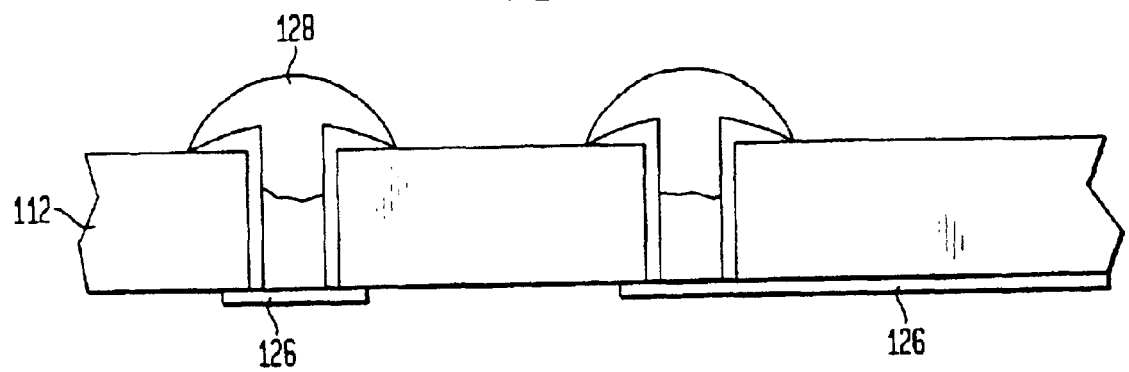

Referring to FIG. 2D, after the expanding air has escaped from the via openings 120, the reflowed solder masses will flow into the via openings. Surface tension will urge the solder masses into a shape that is substantially similar to that shown in FIG. 2D. Because the air and/or flux vapors can escape from the vias before the vias are covered by the reflowed solder material, use of the present inventive method will reduce the number of voids formed during a solder balls attach operation.

Figure 2E:
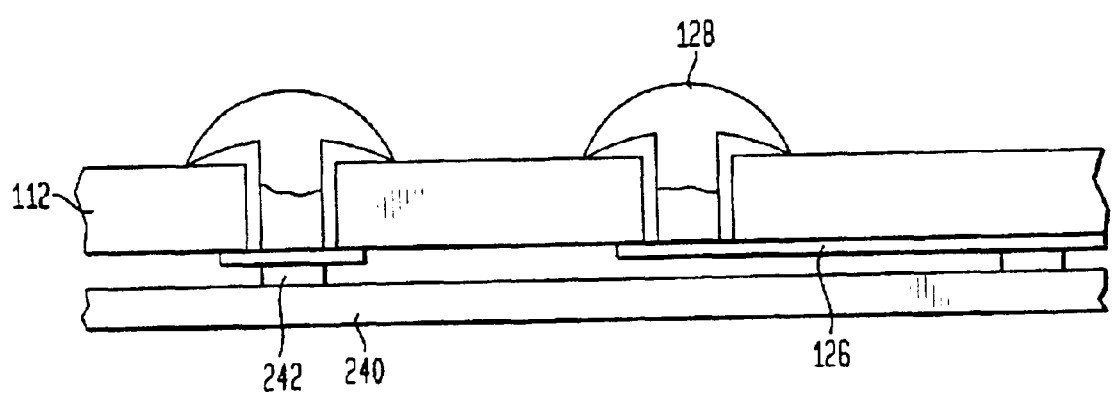

FIG. 2E shows the connection component 112 electrically connected with a substrate element 240 having one or more contacts 242. Specifically, either before or after the solder masses 128 have been reflowed, substrate 240 and connection component 112 are juxtaposed with one another so that leads 126 are connectable with the contacts 242 of substrate 240. Tip ends of the leads may then be bonded to contacts 242. Substrate element 240 may be connected to another electronic component by electrically connecting the solder masses 128 to such electronic component.

Figure 2F:
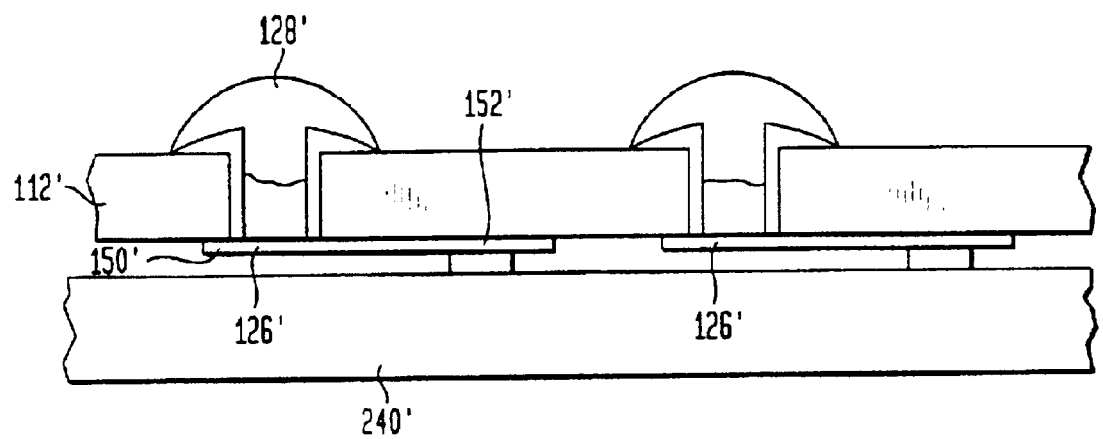
FIGS. 2F–2G shows a microelectronic package having attached solder masses, in accordance with further preferred embodiments of the present invention.
Figure 2G:
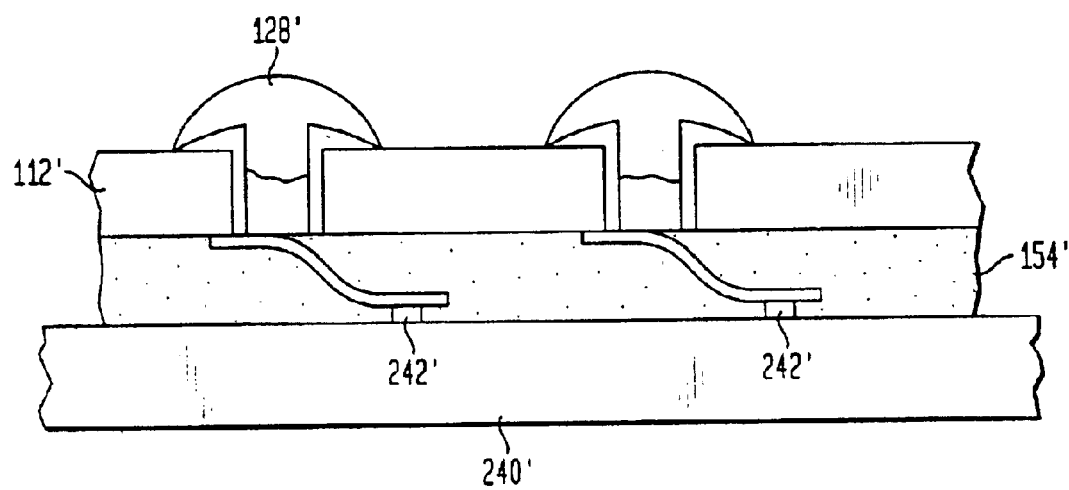

FIGS. 2F and 2G show a connection component 112' electrically connected with a microelectronic element 240' such as a semiconductor chip having one or more contacts 242'. Specifically, either before or after the solder masses 128' have been reflowed, semiconductor chip 240' and connection component 112' are juxtaposed with one another so that leads 126' are connectable with contacts 242' of semiconductor chip 240'. The connection component 112' is preferably a dielectric sheet having an area array of elongated, strip-like leads 126'. Each lead 126' has a terminal end 150' fastened to the sheet 112' and a tip end 152' detachable from the sheet. Referring to FIG. 2F, before the leads 126' are connected to chip contacts 242', each lead 126' extends horizontally parallel to the sheet 112', from its terminal end 150' to its tip end 152'. The tip ends 152' are then attached to the contacts 242' of the semiconductor chip 240'. The connection component 112' and the semiconductor chip 240' are then moved relative to one another to advance the tip end 152' of each lead 126' vertically away from the connection component 112' and deform the leads 126' into a bent, vertically extensive configuration. The preferred structures provide semiconductor chip assemblies with a planar area array of contacts on the chip, an array of terminals on the sheet positioned so that each terminal is substantially over the corresponding contact, and an array of metal S-shaped leads connected between the terminals and contacts. A compliant dielectric material 154' may be provided between the connection component 112' and semiconductor chip 240', substantially surrounding the S-shaped leads 126'. Certain features shown in FIGS. 2F and 2G are described in commonly assigned U.S. Pat. Nos. 5,518,964; 5,798,286 and 5,976,913, the disclosures of which are hereby incorporated by reference herein. The '964, '286 and '913 patents disclose, in certain preferred embodiments, methods of simultaneously connecting the tip ends of a plurality of leads to an area-array of contacts on a microelectronic element such as a semiconductor wafer of chip.

Figure 3A:
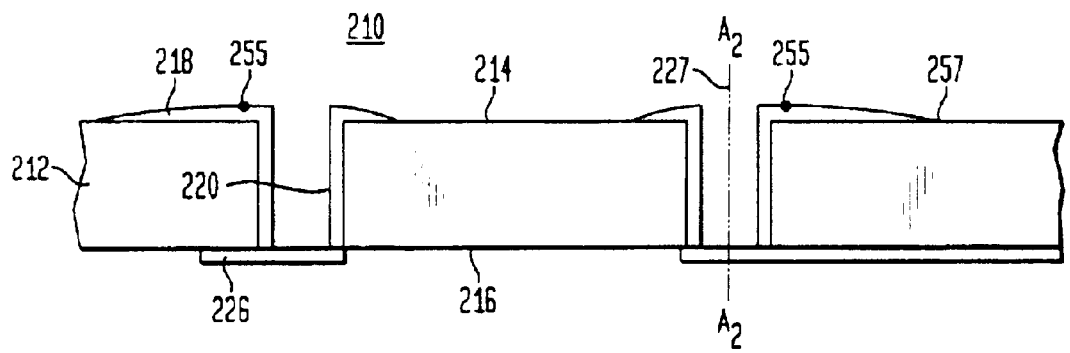
Figures 1, 3A:
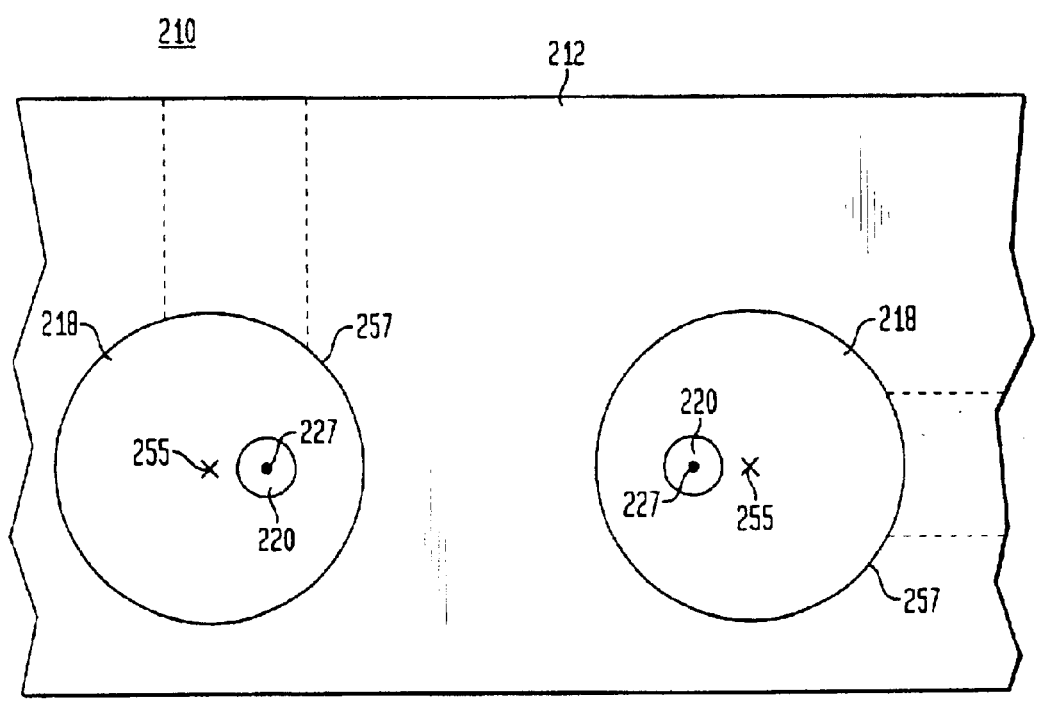

FIGS. 3A through 3C-1 show another method for attaching solder balls to a microelectronic component. Referring to FIGS. 3A and 3A-1, connection component 210 includes flexible dielectric sheet 212 having first surface 214 and second surface 216 remote therefrom. The connection component 210 includes conductive pads 218 formed atop the first surface 214 of the dielectric sheet and conductive metal lined vias 220 extending between the first surface 214 and the second surface 216 of the dielectric sheet 212. The metal lined vias 220 have first ends connected to the conductive pads 218 and second ends connected to conductive traces 226.

Referring to FIGS. 3A and 3A-1, each conductive pad 218 preferably has a center 255. The center 255 of each pad is desirably located at a point that is equidistant from the edges 257 of the pad. Each via 220 also has a center 227 (extending along axis $A_2$—$A_2$ of FIG. 3A). In preferred embodiments, the center 227 of the vias 220 are offset from the centers 255 of the conductive pads 218. In other preferred embodiments, the vias 220 may be described as being positioned adjacent to and/or next to one of the edges 257 of the conductive pads 218.

Figure 3B:
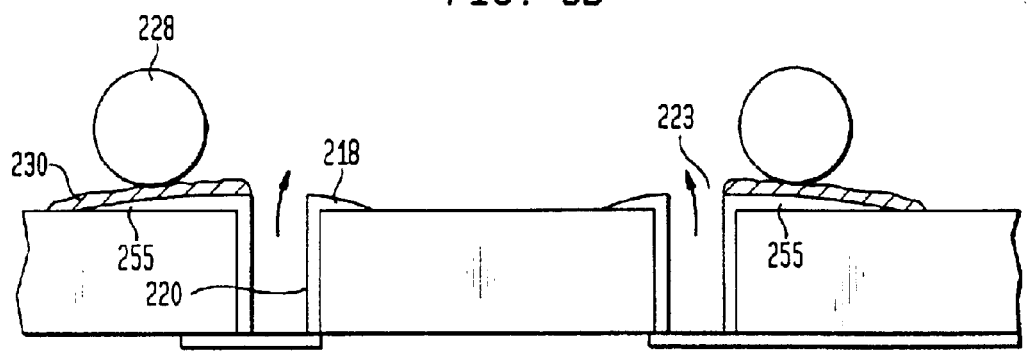
Figures 1, 3B:
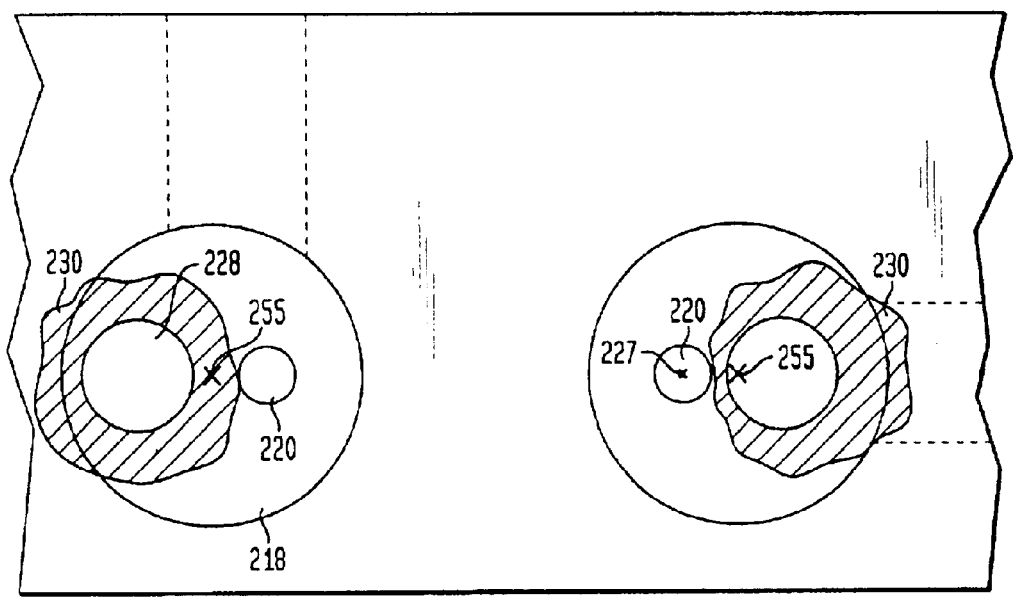
Figure 3C:
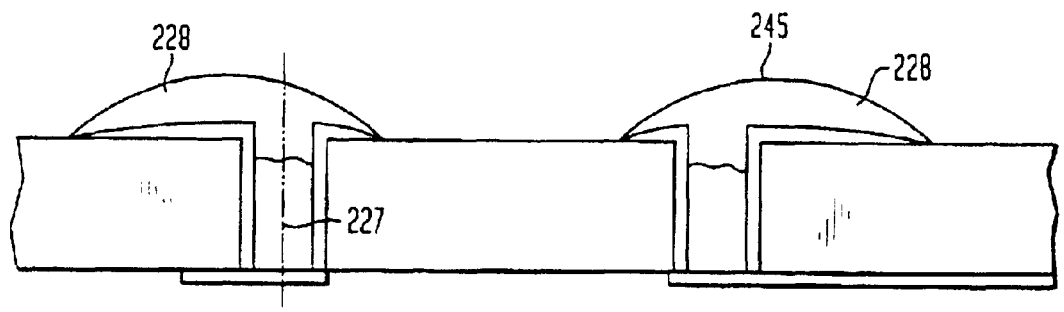
Figures 1, 3C:
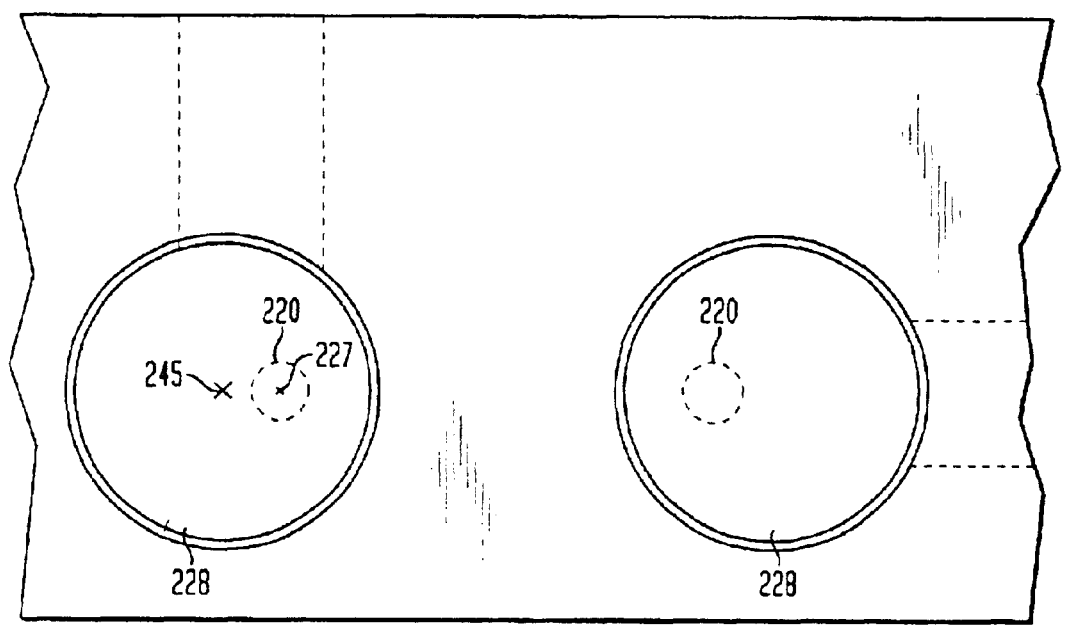

Referring to FIG. 3B, flux 230 is placed atop the conductive pads 218. Because the centers 227 of vias 220 are offset from the centers 255 of the conductive pads 218, the flux 230 does not completely cover the via opening 223. Solder balls 228 are then placed atop and held in place by the flux 230. FIG. 3B-1 shows a top view of connection component 210. Although the solder balls 228 are positioned atop the conductive pads 218, the solder balls and flux 230 do not completely cover the via openings 220. In certain preferred embodiments, the flux may not cover any portion of the vias 220. As a result, as shown in FIG. 3B, when the solder balls are heated up to reflow the solder material, the air and flux solvent within the via 220 is able to escape through the via opening 223.

Referring to FIGS. 3B and 3B-1, the escaping air, indicated by arrow 238, essentially passes from the via and past the solder material 228 before the solder material closes the via opening. As a result, there is no expanding air or flux solvent trapped in the vias which may create voids in the solder material. As a result, referring to FIGS. 3C and 3C-1, the solder bumps 228 formed during reflow are substantially solid (i.e., substantially no voids) and will thus be significantly more reliable then the solder bumps formed using the prior art methods disclosed in FIGS. 1A–1D. Moreover, the apexes 245 of the solder bumps 228 are offset from the centers 227 of vias 220.

In other preferred embodiments, the connection component may be a microelectronic package such as a semiconductor chip package, a rigid substrate, a rigid circuit board, a semi-rigid circuit board, a ceramic circuit board, a printed circuit board or a multilevel substrate.

In certain preferred embodiments, the solder balls may be positioned atop the conductive pads without using a flux material. In these embodiments, the solder balls may be held in place with a stencil until the solder balls are reflowed for bonding to the conductive pads. This flux-less solder ball placement may take place within a vacuum to avoid oxidation of the conductive pads or the solder balls.

EXPERIMENTAL DATA

Currently, two metal layer dielectric tape having conductive pads, with centered through hole vias, has been shown to experience significant solder ball void formation when using the steps shown in FIGS. 1A–1D. High levels of solder ball voiding (e.g., in some instances over fifty percent of the attached solder balls have voids) may occur due to expanding air and/or flux becoming entrapped within the vias. Some efforts at reducing solder ball voiding have focused on adjusting the time and/or temperature parameters during reflow. Although controlling the time and temperature variables may reduce the frequency of voiding to some extent, the resulting level of voiding still remains high (i.e., 20% of solder balls) and the size of the voids still averages about 5 mils in diameter (matching the via diameter). Ultimately, voiding frequency and the average size of the voids were most significantly reduced when using the off-center flux and ball placement methods of the present invention shown in FIGS. 2A–2D and 3A through 3C-1. Specifically, the off-center flux and ball placement methods of the present invention resulted in voiding levels of less than five percent with the size of the voids being significantly lower than the diameter of the vias.

FIG. 4 is a chart that summarizes the results obtained for various solder ball placement methods including prior art solder ball placement methods and methods of placing solder balls in accordance with preferred embodiments of the present invention. The chart sets forth a series of 17 tests or "splits." Splits 1–9 were directed to efforts to minimize voiding problems by varying time and temperature factors. A post flux-print bake was attempted on several of the splits in an attempt to de-gas the volume of flux contained within the vias prior to solder ball reflow. The post flux-print bake and higher times and temperatures did offer some improvement. However, the percentage of attached solder balls having voids was still significant.

In splits 10–12, a solder paste was pre-applied to contact pads (instead of flux) and reflowed in an attempt to fill the vias prior to solder ball placement. This process was found to be unworkable due to the solder's tendency to wet and spread along the entire surface of the contact pad and via sidewalls as well as the difficulty in printing a uniform quantity of solder paste throughout the entire substrate area. Even when ample quantities of paste were used, a small cup-shaped cavity would still usually form over the top of the vias.

Split 13 is the first of the listed experiments that used off-center flux and ball placement with an extended reflow profile. The flux was dispensed over an edge of the contact pad instead of the center of the contact pad to minimize the quantity of flux deposited in the vias. A solder ball was then placed within the same area as the flux so that most if not all of the via hole was left exposed. During reflow, the solder balls were found to self-center on the pads, but only after excess air and/or flux solvent had an opportunity to evacuate through the partially exposed via opening, thereby allowing the solder alloy to accumulate with substantially fewer voids.

Split 14 used the off-center solder ball placement step with the standard reflow profile having a 195° C. peak temperature (as compared to 225° C. for Split 13). Although the size of the voids remained well below 5 mils in diameter, the frequency of the voids increased significantly from an average of 7 voids per 188 solder balls to an average of 25 voided solder balls out of 188 solder balls attached. Thus, it appears that higher peak reflow temperatures may help prevent void formation. Splits 16 and 17 were processed in the same as split 13 and achieved similar results as were achieved in split 13.

What is claimed is:

1. A connection component comprising:
   a dielectric element having a first surface and a second surface;
   conductive pads on the first surface of the dielectric element, each conductive pad having a center;
   conductive vias electrically connected to said conductive pads and extending toward the second surface of said dielectric element, each said via having an opening at one of said conductive pads, wherein at least one of the via openings is offset from the center of at least one of said conductive pads; and
   a fusible mass positioned atop the at least one of said conductive pads having the offset via opening, wherein said fusible mass is at least partially reflowed for permanently attaching said fusible mass to the at least one of said conductive pads and wherein the offset via opening is at least partially exposed.

2. The connection component as claimed in claim 1, wherein each said via has a center, and wherein the centers of one or more of said vias are offset from the centers of one or more of said conductive pads.

3. The method as claimed in claim 1, wherein each said via has a center, and wherein the centers of said vias are offset from the centers of said conductive pads.

4. The method as claimed in claim 1, wherein each said via has a closed end opposite the opening thereof and adjacent the second surface of said dielectric element.

5. The connection component as claimed in claim 1, wherein said fusible mass is attached to the at least one of said conductive pads having the offset via opening, adjacent to the at least one offset via opening.

6. The connection component as claimed in claim 1, wherein said dielectric element is a flexible dielectric sheet.

7. The connection component as claimed in claim 1, further comprising conductive traces overlying the second surface of said dielectric element, said conductive traces being electrically interconnected with said conductive vias.

8. The connection component as claimed in claim 1, wherein said vias extend in a direction that intersects planes defined by the first and second surfaces of said dielectric element.

9. The connection component as claimed in claim 1, wherein said conductive vias comprise a conductive metal.

10. The connection component as claimed in claim 1, wherein said conductive vias are covered by a conductive polymer.

11. A connection component comprising:
    a dielectric element having a first surface and a second surface;
    a conductive pad having a center on the first surface of the dielectric element;
    a conductive via electrically connected to the conductive pad and extending toward the second surface of the dielectric element, wherein the via has an opening at the conductive pad and is offset from the center thereof; and
    a fusible mass in contact with the conductive pad, wherein said fusible mass does not completely obstruct said via opening so that said via opening is at least partially exposed.

12. The connection component as claimed in claim 11, further comprising a flux material in contact with said fusible mass.

13. The connection component as claimed in claim 12, further comprising a flux material in contact with said conductive pad.

14. The connection component as claimed in claim 11, wherein said fusible mass is at least partially liquid.

15. The connection component as claimed in claim 11, wherein said fusible mass is at least partially liquid and partially solid.

16. The connection component as claimed in claim 11, wherein said fusible mass comprises a metallic solder material.

17. A connection component comprising:
    a dielectric element having a first surface and a second surface;
    a conductive pad having a center on the first surface of the dielectric element;
    a conductive via electrically connected to the conductive pad and extending toward the second surface of the dielectric element, wherein the via has an opening at the conductive pad and is offset from the center thereof; and
    a flux material in contact with the conductive pad, wherein said flux material does not completely obstruct said via opening so that said via opening is at least partially exposed.

* * * * *